United States Patent
Doglio et al.

(10) Patent No.: US 9,483,089 B2
(45) Date of Patent: Nov. 1, 2016

(54) SYSTEM AND METHOD FOR INTEGRATING MULTIPLE SERVERS INTO SINGLE FULL HEIGHT BAY OF A SERVER RACK CHASSIS

(71) Applicants: Jean Doglio, Pflugerville, TX (US); Bernard D. Strmiska, Round Rock, TX (US); Brandon J. Brockelsby, Pflugerville, TX (US); Laurent A. Regimbal, Round Rock, TX (US); Sandor Farkas, Round Rock, TX (US); Shawn P. Hoss, Round Rock, TX (US); Vibora Sim, Spring, TX (US)

(72) Inventors: Jean Doglio, Pflugerville, TX (US); Bernard D. Strmiska, Round Rock, TX (US); Brandon J. Brockelsby, Pflugerville, TX (US); Laurent A. Regimbal, Round Rock, TX (US); Sandor Farkas, Round Rock, TX (US); Shawn P. Hoss, Round Rock, TX (US); Vibora Sim, Spring, TX (US)

(73) Assignee: DELL PRODUCTS, LP, Round Rock, TX (US)

( * ) Notice: Subject to any disclaimer, the term of this patent is extended or adjusted under 35 U.S.C. 154(b) by 572 days.

(21) Appl. No.: 13/650,654

(22) Filed: Oct. 12, 2012

(65) Prior Publication Data

US 2014/0108692 A1    Apr. 17, 2014

(51) Int. Cl.
*G06F 1/16* (2006.01)
*G06F 1/18* (2006.01)
*H05K 7/14* (2006.01)

(52) U.S. Cl.
CPC .............. *G06F 1/183* (2013.01); *H05K 7/1489* (2013.01)

(58) Field of Classification Search
CPC ................... G06F 1/181; G06F 1/183–1/186; H05K 7/1409; H05K 7/142; H05K 7/1485–7/1489
See application file for complete search history.

(56) References Cited

U.S. PATENT DOCUMENTS

| | | | | |
|---|---|---|---|---|
| 4,821,145 | A | * | 4/1989 | Corfits et al. ................. 361/692 |
| 6,122,161 | A | * | 9/2000 | Gierut .......................... 361/788 |
| 6,421,252 | B1 | * | 7/2002 | White et al. .................. 361/797 |
| 6,636,428 | B2 | * | 10/2003 | Follmer et al. ............... 361/797 |
| 6,762,934 | B2 | | 7/2004 | Kitchen et al. |
| 6,831,832 | B2 | * | 12/2004 | Haager et al. ........... 361/679.39 |

(Continued)

OTHER PUBLICATIONS

Beal, Vangie; "All About Blade Servers"; Webopedia; May 19, 2005; available online at www.webopedia.com.*

(Continued)

*Primary Examiner* — Nimesh G Patel
(74) *Attorney, Agent, or Firm* — Larson Newman, LLP

(57) ABSTRACT

An information handling system includes a server rack chassis, an adaptor assembly, and second and third servers. The server rack chassis includes a bay adapted to receive a first server that has a height that is substantially equal to a height of the bay. The adaptor assembly is inserted within the bay and includes first, second, third, and fourth slots to receive servers. The adaptor assembly is substantially the same size and dimension as the first server. The second server is inserted within the first slot of the adaptor assembly, and includes a first communication fabric. The height of the second server is substantially equal to a quarter of the height of the bay. The third server is inserted within the second slot of the adaptor assembly, and includes a second communication fabric. The height of the third server is substantially equal to a quarter of the height of the bay.

20 Claims, 5 Drawing Sheets

(56) References Cited

U.S. PATENT DOCUMENTS

| | | | |
|---|---|---|---|
| 6,912,132 B2 | 6/2005 | Riddiford et al. | |
| 7,576,979 B1 | 8/2009 | Dearborn et al. | |
| 7,684,208 B2* | 3/2010 | Okamoto et al. | 361/798 |
| 8,156,356 B2* | 4/2012 | Lambert | 713/320 |
| 2002/0135987 A1* | 9/2002 | Baldwin et al. | 361/730 |
| 2003/0002253 A1 | 1/2003 | Hillyard et al. | |
| 2003/0161101 A1 | 8/2003 | Hillyard et al. | |
| 2006/0023430 A1 | 2/2006 | Karstens | |
| 2007/0047536 A1* | 3/2007 | Scherer et al. | 370/360 |
| 2007/0094531 A1* | 4/2007 | Ni et al. | 714/4 |
| 2007/0205822 A1* | 9/2007 | Jovanovich et al. | 327/526 |
| 2007/0207720 A1* | 9/2007 | Henry et al. | 454/184 |
| 2008/0239648 A1* | 10/2008 | Okamoto et al. | 361/683 |
| 2008/0239649 A1* | 10/2008 | Bradicich et al. | 361/683 |
| 2008/0239689 A1* | 10/2008 | Okamoto et al. | 361/807 |
| 2008/0244052 A1* | 10/2008 | Bradicich et al. | 709/223 |
| 2008/0259555 A1* | 10/2008 | Bechtolsheim et al. | 361/686 |
| 2009/0080165 A1 | 3/2009 | Barina et al. | |
| 2009/0086456 A1 | 4/2009 | Milo et al. | |
| 2009/0157958 A1* | 6/2009 | Maroney et al. | 711/114 |
| 2009/0276513 A1* | 11/2009 | Holdaway et al. | 709/223 |
| 2009/0284907 A1 | 11/2009 | Regimbal et al. | |
| 2010/0149737 A1* | 6/2010 | Shtargot et al. | 361/679.02 |
| 2010/0180135 A1* | 7/2010 | Lambert | 713/323 |
| 2013/0013956 A1* | 1/2013 | Armstrong et al. | 714/4.12 |
| 2014/0084763 A1* | 3/2014 | Doglio et al. | 312/223.2 |
| 2014/0084764 A1* | 3/2014 | Doglio et al. | 312/223.2 |

OTHER PUBLICATIONS

"M-Series I/O Guide I/O Connectivity Options for M1000e and M-Series Blades"; Dell Inc.; Mar. 2012; slides 1-36.*

* cited by examiner

SYSTEM AND METHOD FOR INTEGRATING MULTIPLE SERVERS INTO SINGLE FULL HEIGHT BAY OF A SERVER RACK CHASSIS

FIELD OF THE DISCLOSURE

This disclosure generally relates to information handling systems, and more particularly relates to a system and method for integrating multiple servers into a single full height bay of a server rack chassis.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow for information handling systems to be general or configured for a specific user or specific use such as financial transaction processing, airline reservations, enterprise data storage, or global communications. In addition, information handling systems can include a variety of hardware and software components that can be configured to process, store, and communicate information and can include one or more computer systems, data storage systems, and networking systems.

A server rack chassis can hold multiple devices, such as servers, power supplies, hard drive bays, and the like. The server rack chassis typically can be configured to receive one or two servers per slot of a bay in the server rack chassis. The servers can each include multiple general communication fabrics to enable the server to communicate with input/output modules of the server rack chassis. Each of the general communication fabrics can create a different node in a network created between the servers and the input/output modules in the server rack chassis.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

Figure 1:
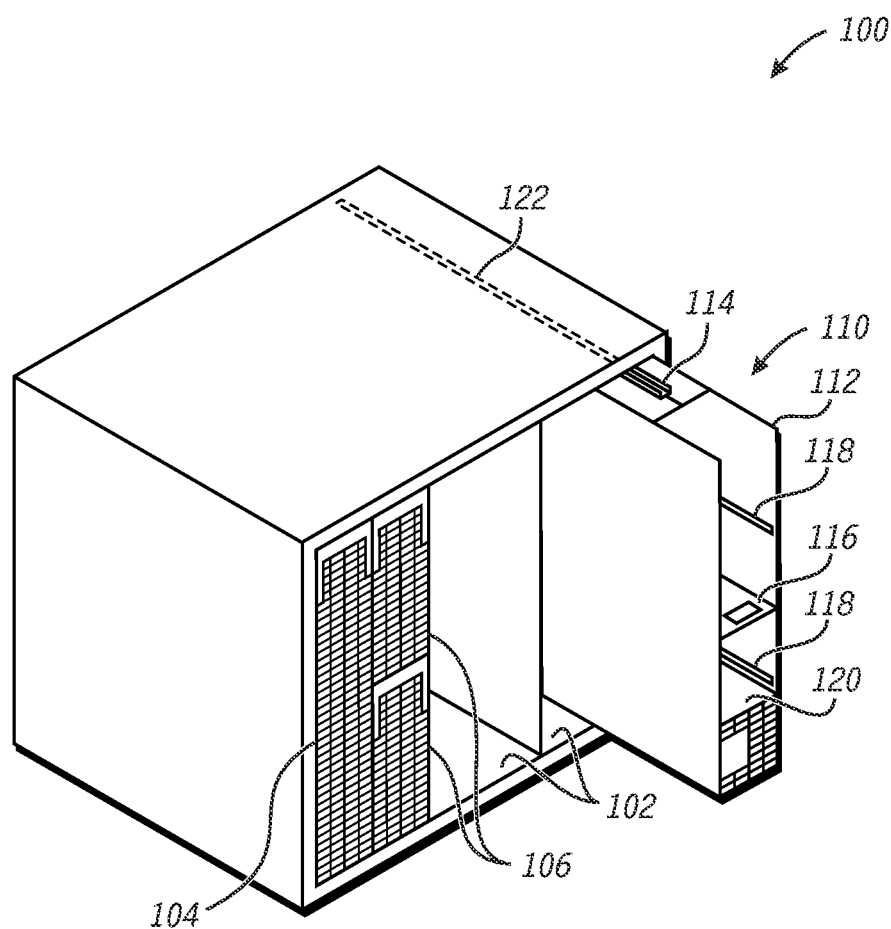
FIG. 1 is a perspective view of a server rack chassis.

FIG. 1 shows a perspective view of a server rack chassis 100 for an information handling system. For purposes of this disclosure, the information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

The server rack chassis 100 includes bays 102 for receiving servers 104 and 106, and an adaptor assembly 110. In an embodiment, the server rack chassis 100 can be a blade server rack, the servers 104 and 106 can be blade servers, and the adaptor assembly 110 can be a blade server adaptor to enable blade servers that could not otherwise fit well within the bay 102 to connect with the server rack chassis. The adaptor assembly 110 includes an enclosure 112, a guide rail 114, a plate 116, and rails 118. The enclosure 112 is a single piece of material, such as metal, that is bent to form the enclosure without any of the portions overlapping. The enclosure 112 is held together by the guide rail 114 attaching to and covering a seam created between the two ends of the enclosure meeting together. The enclosure 112 can be designed without a front portion or a back portion so that the server 120 can be inserted into the adaptor assembly 110 and connected to the server rack chassis 100. In another embodiment, the enclosure 112 can include a back portion having openings that enable the server 120 to engage and connect with a midplane of the server rack chassis 100.

The plate 116 is mounted within the middle of enclosure 112 to provide structural support to the enclosure, and the rails 118 are mounted on the inside of the walls to provide alignment and support of servers 120 within the enclosure. The adaptor assembly 110 can be designed to receive multiple servers 120. In an embodiment, the server 104 can be a full height server, the servers 106 can be half height servers, and the server 120 can be a quarter height server. With respect to this disclosure, full height indicates that the server is about the height of the bay 102, half height indicates that the server is about half of the height of the bay, and quarter height indicates that the server is about a quarter of the height of the bay. While the embodiments are discussed with respect to a blade server chassis and blade servers, the adaptor assembly 110 can be used to provide alignment for any type of device within any type of chassis.

In an embodiment, each bay 102 of the server rack chassis 100 can receive multiple servers. For example, the bay 102 can receive two servers 104, one server 104 and two servers 106, or four servers 106. Additionally, the adaptor assembly can take up substantially the same amount of space in the bay 102 as the server 104, such that the bay can receive two adaptor assemblies 110. However because each bay 102 can vary in size, the number of servers 104 and 106, and the number of adaptor assemblies 110 that can fit within a single bay can also vary.

The guide rail 114 can align with a chassis rail 122 of the server rack chassis 100 to align the adaptor assembly 110 within the bay 102. The adaptor assembly 110 can then slide into the bay 102 at a desired orientation based upon the guide rail 114 sliding along the chassis rail 122. The adaptor assembly 110 can be locked into place within the bay 102 via a locking mechanism 202, shown in FIG. 2. After the adaptor assembly 110 is locked into place within the bay 102, one or more servers 120 can be inserted into the adaptor assembly and connected to a backplane of the server rack chassis 100. The locking mechanism 202 is configured to fit within a void of the enclosure 112 between a server 120 and the server rack chassis 100.

Figure 2:
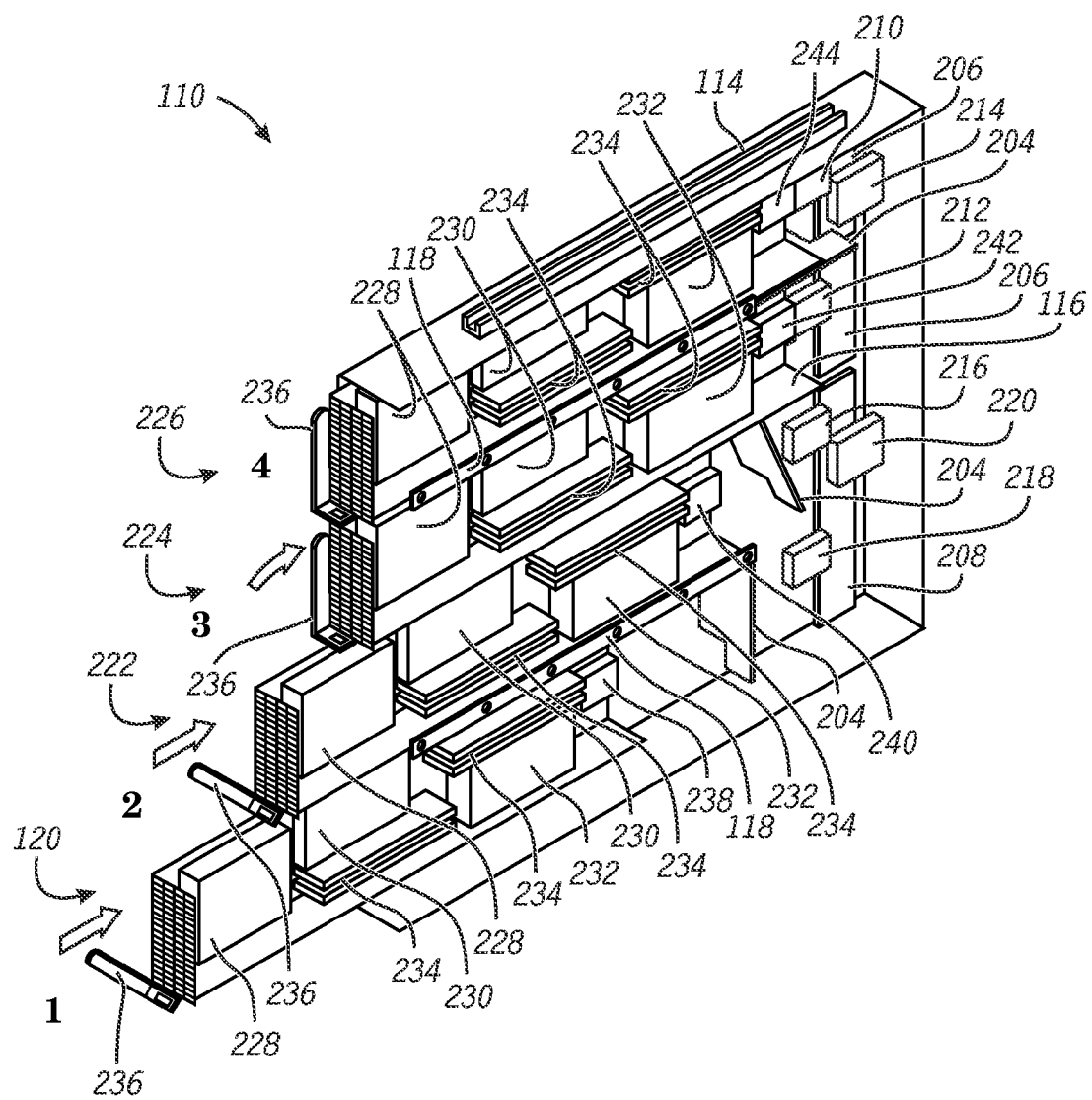
FIG. 2 is a perspective view of an adaptor assembly and a plurality of servers.

FIG. 2 shows the adaptor assembly 110 including the locking mechanism 202, doors 204, a first interposer board 206, and a second interposer board 208, the guide rail 114, the plate 116, and the rails 118. In an embodiment, the first interposer board 206 and the second interposer board 208 can be incorporated within a single physical board, can be separated into additional boards, or the like. The first interposer board 206 includes a first connector 210, a second connector 212, and a connector 214. The second interposer board 208 includes connectors 216 and 218, and a connector 220. Servers 120, 222, 224, and 226 can be inserted within the adaptor assembly 110. The servers 120, 222, 224, and 226 are substantially similar servers, such that each of the servers includes a hard disk drive 228, processors 230 and 232, and dual inline memory modules (DIMMs) 234, and a handle 236. The servers 120, 222, 224, and 226 also include a respective (I/O) connector 238, 240, 242, and 244. Each of the servers 120, 222, 224, and 226 can be either a general purpose node, a compute node, a memory node, or the like. For example, the servers 120, 222, 224, and 226 can be compute nodes if the hard disk 228 is removed from the servers, and can be memory nodes if the processors 230 and 232 are removed from the servers.

The air flow can be provided to the adaptor assembly 110 from the server rack chassis 100, such that the adaptor assembly and each of the servers 120, 222, 224, and 226 receive air from a common cooling fan source within the server rack chassis 100. The adaptor assembly 110 preferably includes four doors 204 to divide each of four slots 246 from an area of the adaptor assembly that includes the interposer boards 206 and 208. When the door 204 associated with a particular slot 246 is in a down position, air flow in the adaptor assembly 110 is blocked from entering that slot. Thus, the air flow in assembly adaptor 110 is not unnecessarily circulated in a slot 246 that does not include a server 120.

The handle 216 of each of the servers 120, 222, 224, and 226 is placed in a down or unlocked position while the server is inserted into a slot 246. As the server 120 is inserted into the adaptor assembly, the server slides along and is supported by a bottom portion of the enclosure 112. Similarly, as the server 222 and the server 226 are inserted within the adaptor assembly 110 the servers slide along and are supported by the rails 118 within adaptor assembly. The plate 116 can support the server 224 as the server is inserted in a slot 246 of the adaptor assembly 110. Each of the servers 120, 222, 224, and 226 is shown in a different stage of insertion into and connection with the adaptor assembly 110.

For example, the server 120 is at a first location within the adaptor assembly 110, which is partially inserted within the slot 246. The server 222 is at a second location within the adaptor assembly 110. In the second location, a top portion of the server 222 can engage the door 204 of the slot 246, and the door can rotate upward as a force is exerted from the server to the door. The server 224 is at a third location within a slot 246 of the adaptor assembly 110. In the third position, the I/O connector 244 of the server 226 is a position to connect with the connector 216 of the interposer board 206. The handle 236 of the server 226 can be raised to an up position and the server can be locked in placed with the slot 246 of the adaptor assembly 110. As the handle 236 is raised the connector 244 can engage with the connector 216. Thus, when the handle is in position four, the up position, the connector 224 of the server 226 is fully mated or connected with the connector 216 of the interposer board 206.

The servers 120, 222, 224, and 226 can be configured as different single nodes in a network that can be created via circuitry in the server rack chassis 100. Thus, the four individual servers 120, 222, 224, and 226 can provide substantially the same number of nodes and the same number of the components, such as the hard drive 228, the processors 230 and 232, and DIMMs 234, as a single full height server 102 or in two half height servers 106 of FIG. 1. However, the nodes and components are split into the four quarter height servers 120, 222, 224, and 226. In an embodiment, the servers 120, 222, 224, and 226 are individually removable servers, such that one of the servers can be shut down and removed from the server rack chassis 100 without having to shut down the remaining servers.

Figure 3:
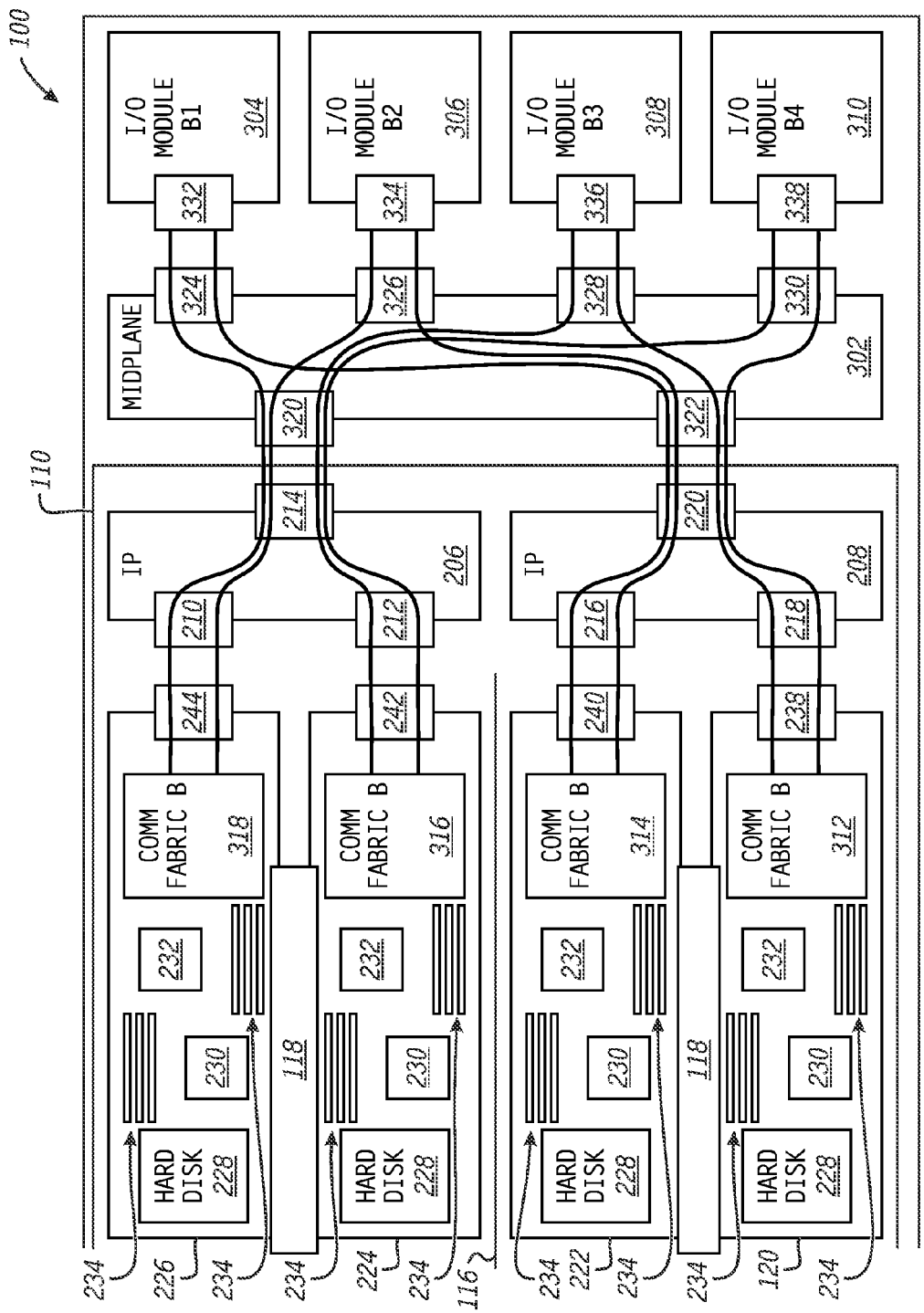
FIG. 3 is block diagram of the server rack chassis, the adaptor assembly, and the plurality of servers.

FIG. 3 shows a block diagram including the server rack chassis 100, the adaptor assembly 110, and the servers 120, 222, 224, and 226. The server rack chassis 100 includes a midplane 302 and input/output (I/O) modules 304, 306, 308, and 310. The midplane 302 includes connectors 320, 322, 324, 326, 328, and 340. The I/O module 304 includes a connector 332. The I/O module 306 includes a connector 334. The I/O module 308 includes a connector 336. The I/O module 310 includes a connector 338. The midplane 302 is in communication with the I/O module 304 via the connector 324 of the midplane and the connector 332 of the I/O module. The midplane 302 is in communication with the I/O module 306 via the connector 326 of the midplane and the connector 334 of the I/O module. The midplane 302 is in communication with the I/O module 308 via the connector 328 of the midplane and the connector 336 of the I/O module. The midplane 302 is in communication with the I/O module 310 via the connector 330 of the midplane and the connector 338 of the I/O module.

The adaptor assembly 110 includes the plate 116, the rails 118, first and second interposer boards 206 and 208. The first interposer board 206 includes the connectors 210 and 212, and the connector 214. The second interposer board 208 includes the connectors 216 and 218, and the connector 220. The server 120 includes a communication fabric 312, the hard disk 228, the processors 230 and 232, and the DIMMs 234, and the connector 238. The server 222 includes a communication fabric 314, the hard disk 228, the processors 230 and 232, and the DIMMs 234, and the connector 240. The server 224 includes a communication fabric 316, the hard disk 228, the processors 230 and 232, and the DIMMs 234, and the connector 238. The server 120 includes a communication fabric 318, the hard disk 228, the processors 230 and 232, and the DIMMs 234, and the connector 238.

The full height server 104 preferably has two connectors to interface with the connectors 320 and 322 of the midplane 302. The half height server 106 preferably has one connector to interface with one of the connectors 320 and 322 of the midplane 302. The server rack chassis 100 can include one midplane 302 for each slot of a bay 102, and the connectors 302 and 322 can connect with either one full height server 104 or with two half height servers 106. When the adaptor assembly 110 is inserted within the server rack chassis 100 the connector 214 of the interposer board 206 connects with the connector 320 of the midplane 302, and the connector 220 of the interposer board 208 connects with the connector 332 of the midplane. Thus, the interposer boards 206 and 208 provide substantially similar connections with the midplane 302 as either one full height server 104 or with two half height servers 106.

When the server 120 is inserted within the adaptor assembly 110, the connector 238 of the server can connect with the connector 218 of the second interposer board 208. The server 222 can connect with the adaptor assembly 110 via the connector 240 of the server connecting with the connector 216. Similarly, the server 224 can connect with the adaptor assembly 110 via the connector 242 of the server connecting with the connector 212 of the first interposer board 206, and the server 226 can connect with the adaptor assembly 110 via the connector 244 of the server connecting with the connector 210 of the second interposer board. Thus, the interposer boards 206 and 208 can convert the four connections from the server 120, 222, 224, and 226 into the two connections that the midplane 302 typically receives. The interposer boards 206 and 208 can be used to transmit any type of signal, such as video, data, or the like, between the servers 120, 222, 224, and 226 and the midplane 302.

The servers 120, 222, 224, and 226 are each quarter height servers, such that the number of components 228 within the server is less than that for the full height server 104 or the half height server 106 shown in FIG. 1. For example, the server 104 can have four general communication fabrics, and each communication fabric can be one of two types of communication fabrics, such as B and C communication fabrics. The server 106 can include two general communication fabrics, and each of the communication fabrics can be a different one of two types of communication fabrics, such as B or C communication fabrics. In an embodiment, each of the communication fabrics 312, 314, 316, and 318 can be the same type of communication fabric, such as B communication fabric. The communication fabrics 312, 314, 316, and 318 can use any type of communication interface, such as peripheral component interconnect express (PCIe), Ethernet, universal serial bus (USB), or the like. Each of the servers 120, 222, 224, and 226 can utilize the respective communicate fabric 312, 314, 316, or 318 to communicate with the I/O modules 304, 306, 308, and 310 via a common communication network. Thus, the servers 120, 222, 224, and 226 can be hot swapped within the adaptor assembly 110, without a user having to verify that a new server has a communication fabric that is similar to the other communication fabrics connected to common I/O module via the interposer 206 or 208 and the midplane 302.

As shown in FIG. 3, each of the communication fabrics 312, 314, 316, and 318 can communicate with two of the I/O modules 304, 306, 308, and 310 to provide redundant communication for the each of the servers 120, 222, 224, and 226. For example, a signal from the server 226 can be sent to the I/O module 304 via connector 238 of the server, connectors 210 and 212 of the adaptor assembly 110, connectors 336 and 328 of the midplane 302, and connector 320 of the I/O module. Similarly, a signal from the server 226 can be sent to the I/O module 306 via connector 238 of the server, connectors 210 and 212 of the adaptor assembly 110, connectors 336 and 330 of the midplane 302, and connector 322 of the I/O module. Each of the servers 120, 222, 224, and 226 can also include a networking communication fabric, and a management communication fabric. The networking communication fabric can be utilized in the servers 120, 222, 224, and 226 to establish and connect with a network created in the server rack chassis 100. The 120, 222, 224, and 226 can use the management communication fabric to communicate with a chassis management control of the server rack chassis 100 to receive updates, configuration information, and the like for the server.

Figure 4:
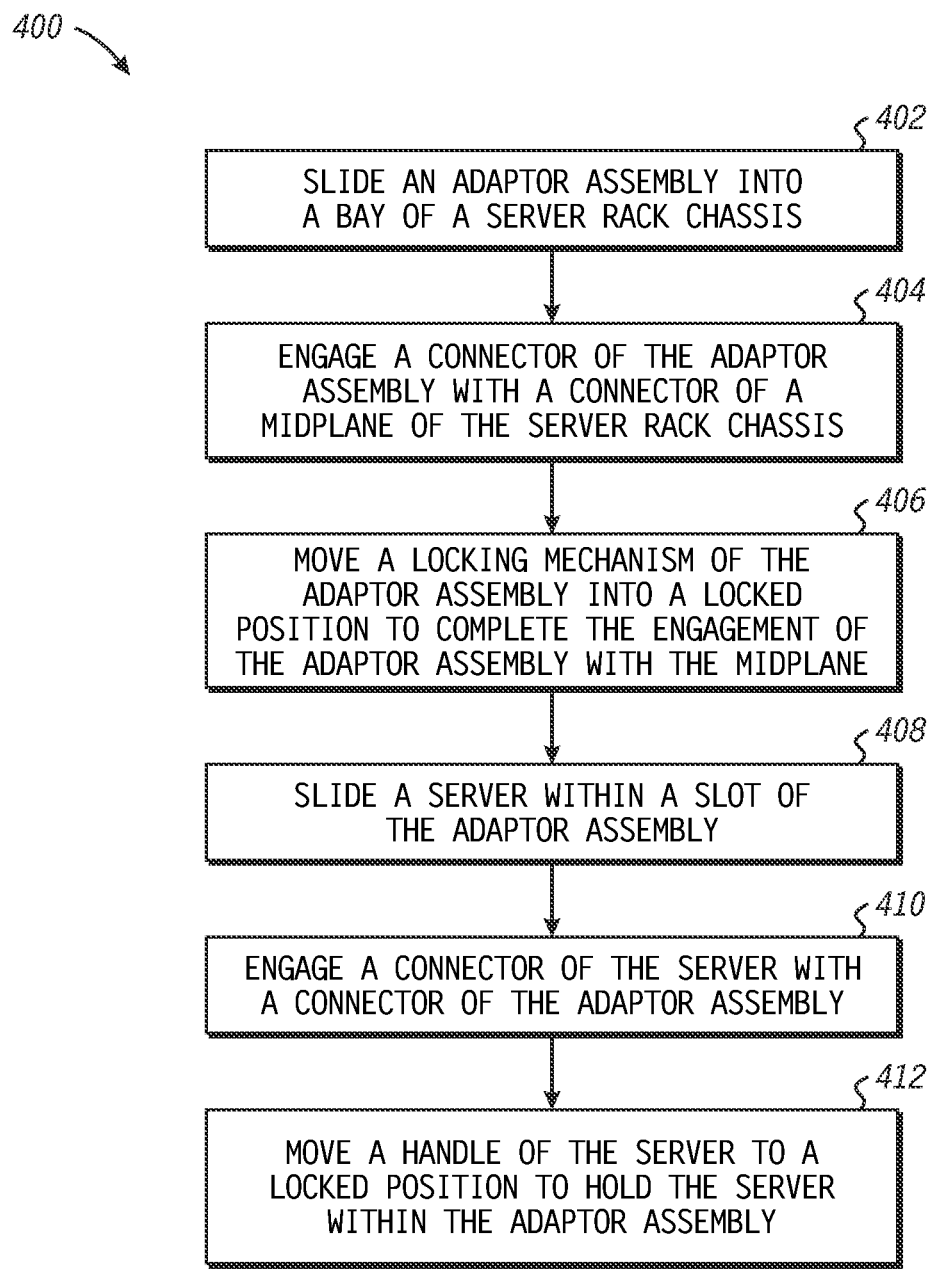
FIG. 4 is a flow diagram of a method for inserting the adaptor assembly and a server within a bay of the server rack chassis.

FIG. 4 shows a flow diagram of a method 400 for inserting an adaptor assembly within a bay of a server rack chassis. At block 402, an adaptor assembly is slid into a bay of a server rack chassis. In an embodiment, the adaptor assembly can be substantially the same size as a standard full height blade server, such that the adaptor assembly extends from a bottom of the bay to the top of the bay. The adaptor assembly can include a guide rail to align the adaptor assembly within the bay of the server rack chassis. An enclosure of the adaptor assembly is preferably a single piece of material, such as sheet metal, and the enclosure is held together by the guide rail without any overlapping of the material.

At block 404, a connector of the adaptor assembly is engaged with a connector of a midplane in the server rack chassis. The connector of the adaptor assembly and the connector of the midplane are preferably both electrical connectors to enable communication between servers within the adaptor assembly and the midplane. The connector of the adaptor assembly can be located on an interposer board or other circuit board that has more connectors on a server side of the board than on the midplane side of the board. For example, the interposer board can have two connectors on the server side and one connector on the midplane side so that two individual quarter height servers can connect to the midplane in a substantially similar way as a single half height server. In another embodiment, the interposer board can have four connectors on the server side and two connectors on the midplane side so that four individual quarter height servers can connect to the midplane is a substantially similar way as a single full height server or two half height servers. In an embodiment, the midplane can be in electrical communication with one or more I/O modules of the server rack chassis so that any server inserted into the adaptor assembly can communicate with the I/O modules via an interposer board and the midplane.

At block 406, a locking mechanism of the adaptor assembly is moved into a locked position to complete the engagement of the adaptor assembly with the midplane. In an embodiment, the locking mechanism can have a low profile, such that the locking mechanism only extends a very minimal height above the adaptor assembly. The locking mechanism can be low profile so that only a small portion of the height of the bay in the server rack chassis is taken by the locking mechanism, and thereby providing more room for the servers.

At block 408, a server is slid into the adaptor assembly. The server can be a quarter height server, such that the height of the server is substantially equal to a quarter of the height of the server rack chassis bay. In an embodiment, an enclosure of the server can be open on the top, such that the components within the server can be accessed and serviced without a cover having to be removed. Additionally, the lack of a top cover can eliminate height in the server that would otherwise be here, which can enable more area for the components of the server.

At block 410, a connector of the server is engaged with a connector of the adaptor assembly, which can both be electrical connectors. In an embodiment, the connector of the adaptor assembly can be located on the interposer board of the adaptor assembly, such that the server can communicate with the midplane via the interposer board. At block 412, a handle of the server is moved to a locked position to hold the server within the adaptor assembly.

Figure 5:
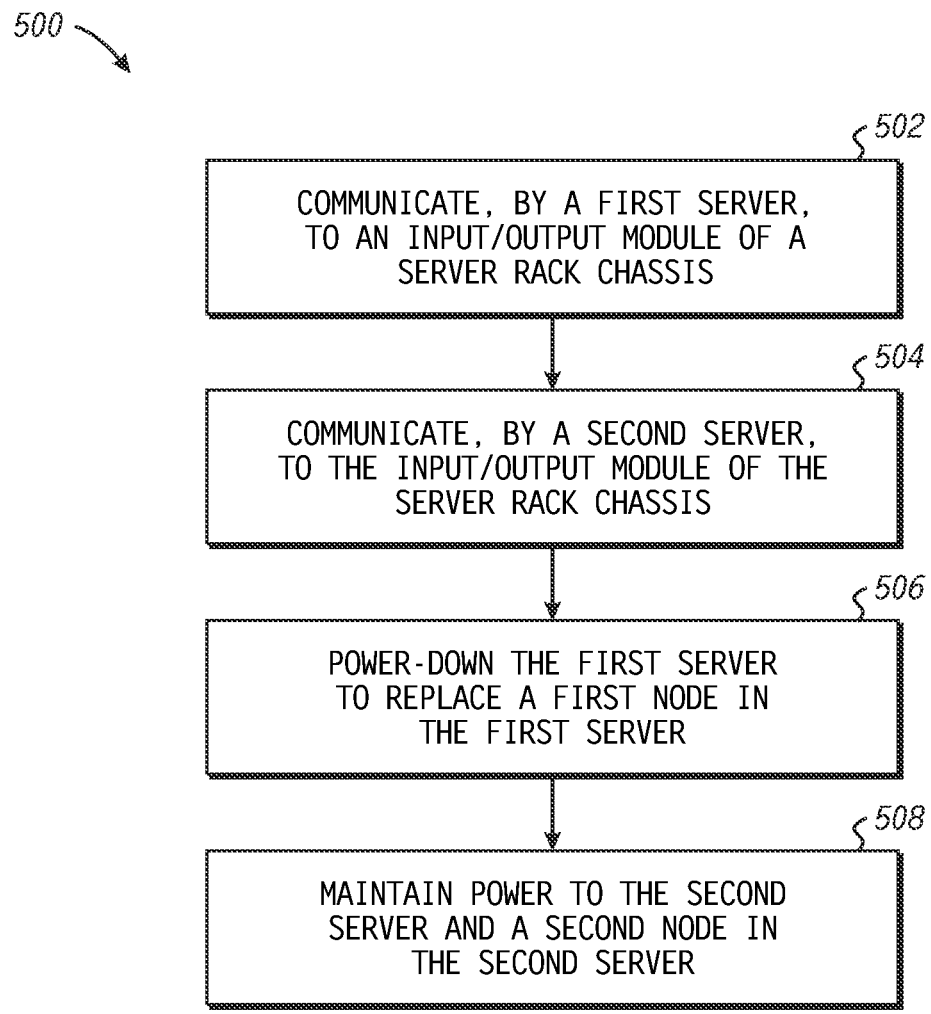
FIG. 5 is a flow diagram of a method of communicating in a network of the server rack chassis.

FIG. 5 shows a flow diagram of a method 500 for communicating in a network of the server rack chassis 100. At block 502, a first server communicates with an I/O module of the server rack chassis. The first server can be located within a first slot of an adaptor assembly in the server rack chassis. In an embodiment, the height of the first server is substantially equal to a quarter of the height of a bay of the server rack chassis. The first server can include a single node of a network created in the server rack chassis. In an embodiment, the first server can communicate with the I/O module via an interposer board of the adaptor assembly and a midplane of the server rack chassis.

At block 504, a second server communicates with the I/O module of the server rack chassis. The first server can be located within a second slot of the adaptor assembly in the server rack chassis. In an embodiment, the height of the second server is substantially equal to a quarter of the height of the bay. The second server can include a single node of the network of the server rack chassis. The first and second servers can be configured to be individually hot swappable in the adaptor assembly. In an embodiment, the second server can communicate with the I/O module via an interposer board of the adaptor assembly and a midplane of the server rack chassis. The number of connectors between the interposer board and the midplane can be less than the number of connectors between the interposer board and the first and second servers. At block 506, the first server is powered down so that the first node can be replaced. Power to the second server and the second node is maintained when the first server is powered down at block 508.

Although only a few exemplary embodiments have been described in detail in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
   a server rack chassis including a bay adapted to receive a first server, wherein a height of the first server is substantially equal to a height of the bay;
   an adaptor assembly inserted within the bay, the adaptor assembly including first, second, third, and fourth slots to receive servers, wherein the adaptor assembly is substantially the same size and dimension as the first server;
   a second server inserted within the first slot of the adaptor assembly, the second server including a first communication fabric, wherein a height of the second server is substantially equal to a quarter of the height of the bay, the adaptor assembly to provide the second server with a redundant communication to first and second input/output modules of the information handling system via a midplane of the server rack chassis; and
   a third server inserted within the second slot of the adaptor assembly, the third server including a second communication fabric, wherein a height of the third server is substantially equal to a quarter of the height of the bay, and wherein the first communication fabric and the second communication fabric are different types, of communication fabric, the adaptor assembly to provide the third server with a redundant communication to third and fourth input/output modules of the information handling system via the midplane, and to provide a common communication network to enable the second and third servers to communicate with the first, second, third, and fourth input/output modules of the information handling system via the midplane even when the second communication fabric is different than the first communication fabric.

2. The information handling system of claim 1 wherein the adaptor assembly further includes:
   an interposer board including a first connector configured to connect with the second server, a second connector configured to connect with the third server, and a third connector configured to connect with the midplane of the server rack chassis.

3. The information handling system of claim 2 wherein the interposer board is configured to provide communication between the second server and the midplane, and between the third server and the midplane, and wherein a number of connectors between the interposer board and the midplane is less than the number of connectors between the interposer board and the second and third servers.

4. The information handling system of claim 1 wherein the adaptor assembly further includes:
   a door connected in a back portion of the first slot, the door to block air flow within the adaptor assembly from entering the first slot when the door is in a down position, and to rotate upward when a force is exerted against the door via the second server to enable the second server to connect with the adaptor assembly.

5. The information handling system of claim 1 wherein the first server includes four nodes of a network of the server rack chassis, the second server including a single node of the network, and the third server including a single node of the network.

6. The information handling system of claim 1 further comprising:
   a fourth server inserted within the third slot of the adaptor assembly, the fourth server including a third communication fabric, wherein a height of the fourth server is substantially equal to a quarter of the height of the bay; and
   a fifth server inserted within the fourth slot of the adaptor assembly, the fifth server including a fourth communication fabric, wherein a height of the fifth server is substantially equal to a quarter of the height of the bay, and wherein the third and fourth communication fabrics are the same type of communication fabrics.

7. The information handling system of claim 6 wherein the first server including four nodes of a network of the server rack chassis, and each of the second, third, fourth, and fifth servers including a single node of the network.

8. The information handling system of claim 6 wherein the second, third, fourth, and fifth servers are individually hot swappable in the adaptor assembly.

9. The information handling system of claim 1 wherein the second and third servers are open to a top of the adaptor assembly based on the second and third servers including only a front panel, a bottom panel, and one side panel to provide access to components with the second and third servers.

10. An information handling system comprising:
a server rack chassis including a bay adapted to receive a first server, wherein a height of the first server is substantially equal to a height of the bay;
an adaptor assembly inserted within the bay, the adaptor assembly including first, second, third, and fourth slots to receive servers, wherein the adaptor assembly is substantially the same size and dimension as the first server;
a second server inserted within the first slot of the adaptor assembly, the second server including a first communication fabric, wherein a height of the second server is substantially equal to a quarter of the height of the bay;
a third server inserted within the second slot of the adaptor assembly, the third server including a second communication fabric, wherein the second communication fabric and the first communication fabric are different types, wherein a height of the third server is substantially equal to a quarter of the height of the bay, and wherein the second and third servers are individually hot swappable in the adaptor assembly; and
an interposer board within the adaptor assembly, the interposer board including a first connector configured to connect with the second server, a second connector configured to connect with the third server, and a third connector configured to connect with a midplane of the server rack chassis, the interposer board to provide a common communication network to enable the second and third servers to communicate with input/output modules of the information handling system via the midplane even when the second communication fabric is different than the first communication fabric.

11. The information handling system of claim 10 wherein the interposer board is configured to provide communication between the second server and the midplane, and between the third server and the midplane, and wherein a number of connectors between the interposer board and the midplane is less than the number of connectors between the interposer board and the second and third servers.

12. The information handling system of claim 10 wherein the adaptor assembly further includes:
a door connected in a back portion of the first slot, the door to block air flow within the adaptor assembly from entering the first slot when the door in a down position, and to rotate upward when a force is exerted against the door via the second server to enable the second server to connect with the adaptor assembly.

13. The information handling system of claim 10 wherein the first server including four nodes of a network of the server rack chassis, the second server including a single node of the network, and the third server including a single node of the network.

14. The information handling system of claim 10 further comprising:

a fourth server inserted within the third slot of the adaptor assembly, the fourth server including a third communication fabric, wherein a height of the fourth server is substantially equal to a quarter of the height of the bay; and
a fifth server inserted within the fourth slot of the adaptor assembly, the fifth server including a fourth communication fabric, wherein a height of the fifth server is substantially equal to a quarter of the height of the bay, and wherein the third and fourth communication fabrics are the same type of communication fabrics as the first and second communication fabrics.

15. The information handling system of claim 14 wherein the first server includes four nodes of a network of the server rack chassis, and each of the second, third, fourth, and fifth servers including a single node of the network.

16. The information handling system of claim 14 wherein the second, third, fourth, and fifth servers are individually hot swappable in the adaptor assembly.

17. A method comprising:
communicating, by a first server, with an input/output module of a server rack chassis, wherein the first server is located with a first slot of an adaptor assembly in the server rack chassis, a height of the first server is substantially equal to a quarter of the height of a bay of the server rack chassis, the first server including a single node of a network of the server rack chassis, and the first server includes a first communication fabric; and
communicating, by a second server, with first and second input/output modules of the server rack chassis via an interposer of the adaptor assembly and a midplane of the server rack chassis, wherein the second server is located with a second slot of the adaptor assembly in the server rack chassis, wherein a height of the second server is substantially equal to a quarter of the height of the bay, the second server including a single node of the network, the second server including a second communication fabric, wherein the first communication fabric and the second communication fabric are different types and the first and second servers are individually hot swappable in the adaptor assembly; and
providing, via the interposer, a common communication network to enable the second and third servers to communicate with input/output modules of the information handling system via the midplane even when the second communication fabric is different than the first communication fabric.

18. The method of claim 17 further comprising;
powering down the first server to replace the first node; and
maintaining power to the second server and the second node when the first server is powered down.

19. The method of claim 17 wherein the first server communicates with the input/output module via the interposer board of the adaptor assembly and the midplane of the server rack chassis, wherein a number of connectors between the interposer board and the midplane is less than the number of connectors between the interposer board and the second and third servers.

20. The method of claim 17 wherein the adaptor assembly is located within the bay, and the adaptor assembly including the first and second slots, and third and fourth slots each to receive servers, wherein the adaptor assembly is substantially the same size and dimension as a full height server that is substantially the same height as the bay.

* * * * *